United States Patent [19]
Burward-Hoy

[11] Patent Number: 5,637,921
[45] Date of Patent: Jun. 10, 1997

[54] SUB-AMBIENT TEMPERATURE ELECTRONIC PACKAGE

[75] Inventor: Trevor Burward-Hoy, Cupertino, Calif.

[73] Assignee: Sun Microsystems, Inc., Mountain View, Calif.

[21] Appl. No.: 426,286

[22] Filed: Apr. 21, 1995

[51] Int. Cl.[6] .......................... H01L 23/34; H01L 23/38
[52] U.S. Cl. .......................... 257/712; 257/930; 361/704; 361/717; 165/80.2
[58] Field of Search .......................... 257/712, 930; 361/704, 717; 165/80.2

[56] References Cited

U.S. PATENT DOCUMENTS

| | | | |
|---|---|---|---|
| 3,481,393 | 12/1969 | Chu | 165/80 |
| 3,868,754 | 3/1975 | Kawano | 29/157.3 A |
| 4,035,007 | 7/1977 | Harrison et al. | 285/381 |
| 4,109,707 | 8/1978 | Wilson et al. | 165/80.4 |
| 4,253,515 | 3/1981 | Swiatosz | 165/61 |
| 4,377,894 | 3/1983 | Yoshida | 29/421 R |
| 4,379,009 | 4/1983 | Shibata et al. | 156/86 |
| 4,418,453 | 12/1983 | Brown et al. | 29/33 M |
| 4,485,429 | 11/1984 | Mittal | 165/104.33 |
| 4,555,945 | 12/1985 | Hanson | 73/517 B |
| 4,620,215 | 10/1986 | Lee | 357/81 |
| 4,866,570 | 9/1989 | Porter | 165/104.33 |
| 4,890,195 | 12/1989 | Heckaman et al. | 361/386 |
| 5,032,897 | 7/1991 | Mansuria et al. | 357/81 |
| 5,056,209 | 10/1991 | Ohashi et al. | 29/517 |
| 5,088,005 | 2/1992 | Ciaccio | 165/104.33 |
| 5,126,919 | 6/1992 | Yamamoto et al. | 361/385 |
| 5,144,531 | 9/1992 | Go et al. | 361/382 |
| 5,183,104 | 2/1993 | Novotny | 165/104.33 |
| 5,188,286 | 2/1993 | Pence, IV | 236/1 F |
| 5,191,511 | 3/1993 | Sawaya | 257/713 |
| 5,200,810 | 4/1993 | Wojnarowski et al. | 361/398 |
| 5,256,902 | 10/1993 | Culver | 165/80.3 |
| 5,263,536 | 11/1993 | Hulburd et al. | 165/104.33 |
| 5,270,572 | 12/1993 | Nakajima et al. | 257/714 |
| 5,313,099 | 5/1994 | Tata et al. | 257/718 |
| 5,316,075 | 5/1994 | Quon et al. | 165/104.33 |
| 5,375,650 | 12/1994 | Mizuno | 165/104.33 |
| 5,375,652 | 12/1994 | Matsunaga et al. | 257/718 |
| 5,397,919 | 3/1995 | Tata et al. | 257/718 |
| 5,430,322 | 7/1995 | Koyanagi et al. | 257/920 |
| 5,434,744 | 7/1995 | Fritz et al. | 361/704 |
| 5,448,107 | 9/1995 | Osada et al. | 257/722 |
| 5,535,816 | 7/1996 | Ishida | 165/185 |

FOREIGN PATENT DOCUMENTS

| | | | |
|---|---|---|---|
| 0295449 | 11/1989 | Japan | 257/930 |
| 0047996 | 8/1991 | Japan | 257/930 |
| 1611679 | 12/1990 | U.S.S.R. | |

OTHER PUBLICATIONS

Johnson, *Device Cooling*, IBM Technical Disclosure Bulletin, vol. 20, No. 10, Mar. 1978, pp. 3919–3920.

*Primary Examiner*—Sara W. Crane
*Assistant Examiner*—David Ostrowski
*Attorney, Agent, or Firm*—Blakely Sokoloff Taylor & Zafman

[57] ABSTRACT

An integrated circuit package having an internal cooling device. The integrated circuit package includes a thermoelectric device that operates according to the Peltier cooling effect. The thermoelectric device includes a first plate and a second plate that are thermally connected by a plurality of conducting elements. A package substrate is attached to the first plate such that a chamber is formed. The second plate is disposed within the chamber apart from the package substrate. The second plate is cooled when power is supplied to the thermoelectric device. By disposing an integrated circuit chip on the second plate and evaluating the chamber, the integrated circuit chip may be cooled to a sub-ambient temperature without internal or external condensation.

11 Claims, 3 Drawing Sheets

SUB-AMBIENT TEMPERATURE ELECTRONIC PACKAGE

FIELD OF THE INVENTION

The present invention relates generally to an integrated circuit (IC) package for enclosing an IC and, more particularly, to an IC package having an internal cooling device.

BACKGROUND OF THE INVENTION

Integrated circuit (IC) chips dissipate heat that must be transferred away from the IC chip to better ensure that the operating temperature of the IC chip remains at or below a maximum safe operating temperature, which is typically defined by the IC chip manufacturer. The maximum safe operating temperature of many IC chips is equal to or greater than the ambient temperature of the environment in which the IC chips operate. Heat sinks and/or air cooling systems may be used to transfer excess heat away from the IC so that the operating temperature of the IC chip is maintained at a safe level.

FIG. 1 shows a typical prior art IC chip package design. IC chip 101 has an operating temperature that is greater than or equal to the ambient temperature. The IC chip package 100 includes a substrate 103 to which IC chip 101 is attached. Bond wires 102 are connected between IC chip 101 and conductors (not shown) disposed in the substrate 103 that lead to the I/O pins 105. Lid 104 covers the cavity in which IC chip 101 is placed and hermetically seals the cavity from the ambient air. Flow arrows 106 indicate that heat flows from IC chip 101 to the ambient air outside of the IC chip package 100. When the operating temperature of IC chip 101 is greater than the ambient temperature of the surrounding environment, it is desirable to have as many thermal paths away from IC chip 101 such that sufficient heat transfer may take place.

For some IC chips it is desirable to reduce the operating temperature below the ambient temperature using some sort of cooling system. When the operating temperature is reduced below the ambient temperature, the direction of flow arrows 106 reverses such that the heat of the ambient air acts to heat IC chip 101. Therefore, a reduction in the number of thermal paths between IC chip 101 and the ambient air is desirable to improve the efficiency of the cooling system.

The prior art discloses that one method for reducing the number of thermal paths between IC chip 101 and the ambient environment outside of IC chip package 100 is to create a vacuum between IC chip 101 and the ambient environment, which isolates IC chip 101 from the ambient environment. However, a typical prior art method for creating a vacuum requires surrounding the entire IC chip package 100 with an evacuated chamber. This solution requires a large amount of printed circuit board space in a computer system. Further, prior cooling systems also typically require a significant amount of printed circuit board space. It would be desirable to provide an integrated circuit package that thermally isolates the IC chip from the ambient and that has an internal cooling device for cooling the integrated circuit so that the amount of printed circuit board space required to cool the IC chip is reduced.

SUMMARY OF THE INVENTION

An integrated circuit package is disclosed. The integrated circuit package includes a thermoelectric device and a package substrate. The thermoelectric device includes a first plate and a second plate that are coupled to one another by a plurality of conducting elements. The package substrate has a cavity formed therein and is attached to the first plate such that a chamber is formed. The second plate is disposed within the chamber apart from the package substrate, and the second plate is cooled when power is supplied to the thermoelectric device. By disposing an integrated circuit chip on the second plate and hermetically sealed the chamber, the integrated circuit chip may be cooled to a sub-ambient temperature without internal or external condensation. The thermoelectric device may include one or more stages.

BRIEF DESCRIPTION OF THE DRAWINGS

The objects, features, and advantages of the method and apparatus of the present invention will be apparent from the following detailed description of the invention in which.

DETAILED DESCRIPTION

An integrated circuit package is described as having an internal thermoelectric cooling device for cooling an integrated circuit chip to a sub-ambient temperature. An integrated circuit chip may be coupled to the thermoelectric cooling device and disposed within an hermetically sealed chamber formed in the integrated circuit package such that the number of thermal paths from the ambient to the IC chip are reduced. The chamber may be evacuated to provide improved isolation of the IC chip from the ambient environment. The integrated circuit package is compact and provides for cooling without internal or external condensation.

In the description that follows there are disclosed a number of specific details and examples. These details and examples, as well as the details and examples shown in the accompanying figures, are provided to illustrate the operation of the various embodiments of the present invention. Accordingly, it will be understood that these details and examples are not exhaustive of the number of ways in which the present invention may be practiced.

Figure 1:
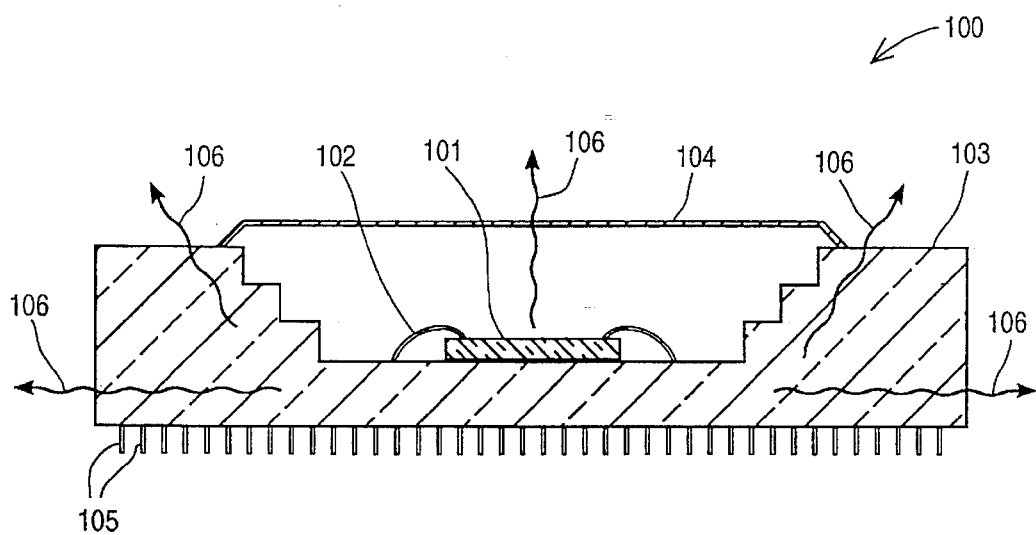
FIG. 1 shows an IC chip package according to the prior art.
Figure 2:
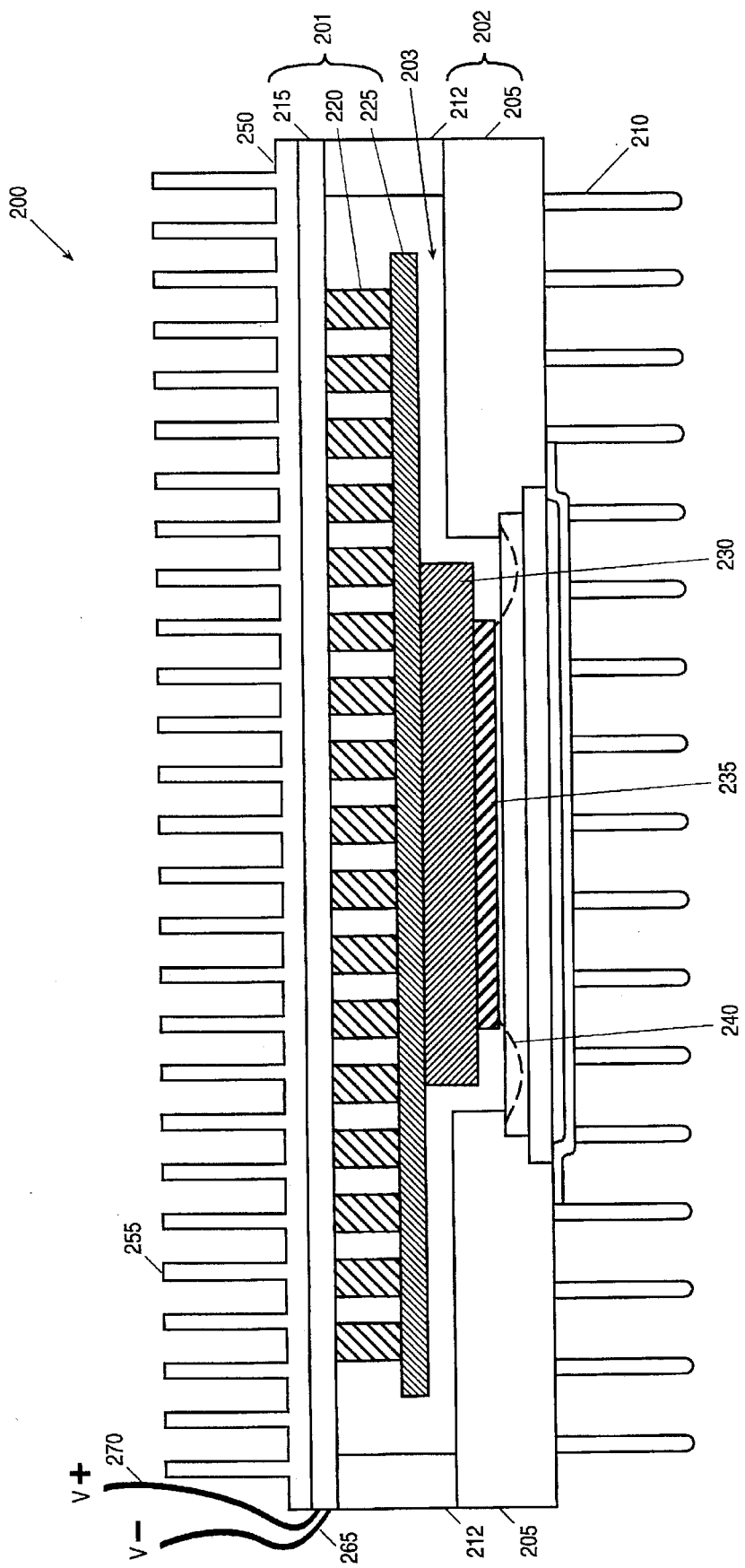
FIG. 2 shows an IC chip package including a single-stage thermoelectric cooling device.

FIG. 2 shows an integrated circuit package 200 that includes a thermoelectric cooling device 201 for cooling an integrated circuit chip 235 to a "sub-ambient" temperature that is less than the temperature of the environment that surrounds integrated circuit package 200. The integrated circuit package 200 generally comprises a thermoelectric cooling device 201 and a package substrate 202 having a cavity formed therein. The thermoelectric cooling device 201 is attached to the package substrate 202 to form an hermetically sealed chamber 203. IC chip 235 is coupled to thermoelectric cooling device 201 within chamber 203 and apart from package substrate 202 such that better thermal isolation from the ambient environment is provided.

Chamber 203 may be evacuated to provide maximum isolation of IC chip 235 from the ambient environment. When chamber 203 is evacuated the only thermal paths between IC chip 235 and the ambient are provided by the electrical interface between IC chip 235 and package substrate 202. FIG. 2 shows the electrical interface as comprising bond wires 240, which are connected to bond pads of the integrated circuit chip and bond pads (not shown) disposed in package substrate 202. The function of the bond wires 240 may be alternatively provided by a flexible circuit carrier attach method such as tape-automated bonding (TAB), which uses a thin polymer tape containing metallic circuitry to electrically connect the integrated circuit chip 235 to the package substrate 202. Because all external surfaces of the integrated circuit package 201 are at or above the ambient temperature, the cooling of IC chip 235 does not result in internal or external condensation.

Thermoelectric cooling device 201 generally comprises a first plate 215, a plurality of conductive elements 220, and a second plate 225. Thermoelectric cooling device 201 operates according to the Peltier cooling effect, wherein heat is absorbed or generated as a current passes through a junction of two dissimilar materials. Thermoelectric cooling devices are commercially available from Marlow Industries of Dallas, Tex., and ITI Ferrotec of Chelmsford, Mass.

Current is provided to the thermoelectric cooling device 201 by an external power supply (not shown) via power lines 265 and 270. Power lines 265 and 270 are shown as providing voltages V− and V+, respectively, which merely indicates that power line 270 provides a more positive voltage than power line 265 and does not imply complementary voltages. When the current is applied to thermoelectric device 201 heat is transferred from the second plate 225 to the first plate 215 by the conductive elements 220 such that the second plate 225 is cooled. A block 230 of heat conducting material, such as copper, thermally couples the integrated circuit chip 235 to the second plate 225 so that IC chip 235 may be cooled to sub-ambient temperatures. The first plate is shown as being larger than the second plate 225 so that the second plate 225 may be disposed in the chamber 203 apart from the package substrate 202, which provides improved isolation from the ambient environment. A heat transfer assembly comprising a base plate 250 and a plurality of fins 255 is attached to the external portion of the first plate 215 for transferring heat away from the first plate 215.

Package substrate 202 generally comprises a bottom 205 and sides 212 such that a cavity is formed. Embedded within the bottom 205 are a number of conductors (not shown) that are coupled between the bond wires 240 and the input-output (I/O) pins 210. The sides 212 provide separation between the bottom substrate 205 and the first plate 215 of the thermoelectric cooling device 201. Generally, the material of the package substrate 202 is a hermetic material such as alumina ($Al_2O_3$) or equivalent. The bottom 205 and sides 212 of package substrate 202 may be joined together using any convenient method that provides an hermetic seal. The first plate 215 of thermoelectric cooling device may be manufactured of the same material as the bottom and sides of the package substrate.

Figure 3:
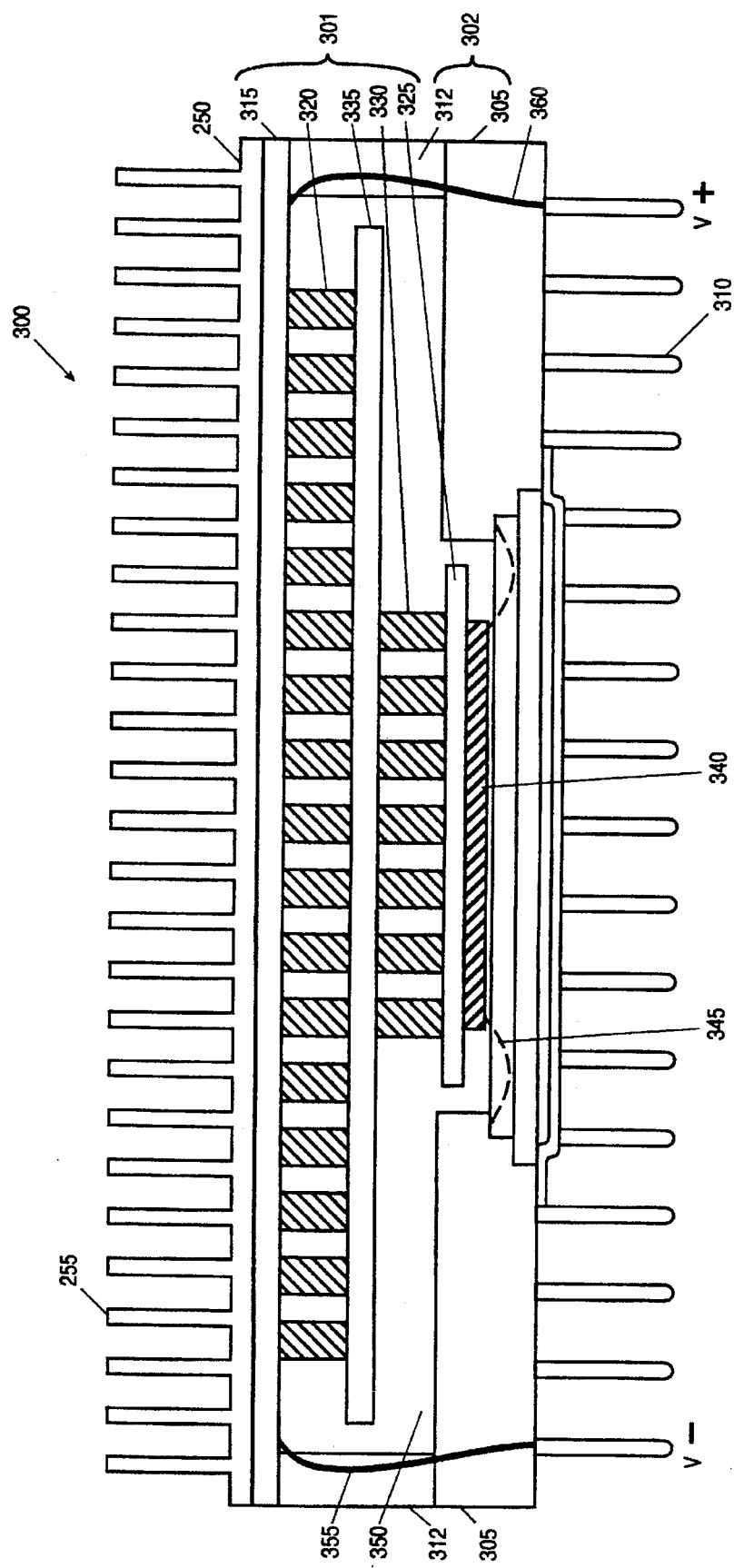
FIG. 3 shows an IC chip package including a multiple-stage thermoelectric cooling device.

FIG. 3 shows an alternative integrated circuit package 300 that includes a multiple stage thermoelectric cooling device 301 and a package substrate 302. Heat transfer assembly 250 is shown as being coupled to integrated circuit package 300.

The multiple stage thermoelectric cooling device 301 is attached to the package substrate 302 to form an hermetically sealed chamber 303 that may be evacuated. IC chip 335 is coupled to the multiple stage thermoelectric cooling device 301 within the chamber 303 and apart from the package substrate 302 such that better thermal isolation from the ambient is provided. When the chamber 350 is evacuated, the only thermal paths between the integrated circuit chip 340 and the ambient environment are provided by electrical connections between integrated circuit chip 340 and package substrate 302.

The multiple stage thermoelectric cooling device 301 comprises a first plate 315, a first plurality of conductive elements 320, a second plate 325, a second plurality of conductive elements 330, and a third plate 335. The second and third plates of the thermoelectric cooling device 301 are disposed within the chamber 303 apart from the package substrate 302. The first stage of thermoelectric cooling device 301 comprises second plate 325, the second plurality of conductive elements 330, and third plate 335. The second stage of the thermoelectric cooling device comprises third plate 335 and the first plurality of conductive elements 320; and first plate 315. IC chip 340 may be coupled directly to the second plate 325. Lower temperatures than those achievable by a single-stage thermoelectric cooling device are reached by using heat rejected from the second stage to supply thermal input to the first stage, which increases the rate of heat transfer.

As shown, the power supply lines 355 and 360 for the thermoelectric device 301 may be routed via the package substrate 302 and coupled to power pins of the integrated circuit package 300. Alternatively, the power supply lines may be provided external to the integrated circuit package 301 as shown in FIG. 2.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A package for enclosing an integrated circuit chip, comprising:
    a multiple stage thermoelectric device including a first plate, a second plate and a third plate thermally connected to one another by a first plurality and a second plurality of conducting elements; and
    a package substrate having a cavity defined therein, the package substrate for attaching to the first plate such that a hermetically sealed chamber is formed, wherein the first plate forms a top wall of the chamber and the second plate is disposed within the chamber apart from the package substrate for receiving the integrated circuit chip, further wherein the third plate is disposed between the first and second plates and apart from the package substrate such that the first plurality of conducting elements is connected between the first plate and the third plate and the second plurality of conductive elements is connected between the second plate and the third plate wherein the integrated circuit chip is thermally coupled to the second plate, the second plate cooling the integrated circuit chip to a sub-ambient temperature in response to an externally supplied current applied to the first plate.

2. The package of claim 1, wherein a heat transfer assembly is coupled to the first plate of the thermoelectric device for transferring heat away from the first plate.

3. The package of claim 1, wherein the chamber is evacuated.

4. A system for cooling an integrated circuit chip to a sub-ambient temperature, comprising:
    a power supply;
    an integrated circuit package for enclosing the integrated circuit chip, the integrated circuit package comprising:

a multiple stage thermoelectric cooling device for cooling the integrated circuit chip to the sub-ambient temperature in response to a current received from the power supply, the thermoelectric cooling device including:
  a first plate coupled to the power supply;
  a second plate;
  a first plurality of conducting elements connected between the first and second plates for conducting current between the first and second plates;
  a third plate that is thermally coupled to the integrated circuit chip for cooling the integrated circuit ship; and
  a second plurality of conducting elements connected between the second and third plates for conducting current between the second and third plates; and
a package substrate attached to the first plate such that a chamber is formed, wherein the second plate, the third plate, and the integrated circuit chip are disposed within the chamber apart from the package substrate, the integrated circuit chip being electrically coupled to the package substrate for transmitting electrical signals.

5. The system for cooling an integrated circuit chip to a sub-ambient temperature of claim 4, wherein the a heat transfer assembly is coupled to the first plate of the thermoelectric device for transferring heat away from the first plate.

6. The system for cooling an integrated circuit chip to a sub-ambient temperature of claim 4, wherein the chamber is evacuated.

7. An integrated circuit package for enclosing an integrated circuit chip, the integrated circuit package comprising:
  a multiple stage thermoelectric cooling device for cooling the integrated circuit chip to the sub-ambient temperature in response to current received from a power supply, the thermoelectric cooling device including:
    a first plate coupled to the power supply;
    a second plate;
    a first plurality of conducting elements connected between the first and second plates for conducting current between the first and second plates;
    a third plate that is thermally coupled to the integrated circuit chip for cooling the integrated circuit chip;
    a second plurality of conducting elements connected between the second and third plates for conducting current between the second and third plates; and
  a package substrate attached to the first plate such that a chamber is formed, wherein the second plate, the third plate, and the integrated circuit chip are disposed within the chamber apart from the package substrate, the integrated circuit chip being electrically coupled to the package substrate for transmitting electrical signals.

8. The package of claim 7, wherein the a heat transfer assembly is coupled to the first plate of the thermoelectric device for transferring heat away from the first plate.

9. The package of claim 7, wherein the chamber is evacuated.

10. A method for cooling an integrated circuit chip to a sub-ambient temperature, comprising the steps of:
  providing a thermoelectric device including a first plate and a second plate that are connected to one another by a first plurality of conducting elements;
  providing a third plate that is connected to the second plate by a second plurality of conducting elements;
  thermally coupling the integrated circuit chip to the third plate;
  providing a package substrate having a cavity formed therein;
  attaching the first plate to the package substrate such that an hermetically sealed chamber is formed, wherein the third plate, the second plate and the integrated circuit chip are disposed within the chamber apart from the package substrate; and
  applying current to the thermoelectric device such that the integrated circuit chip is cooled.

11. The method of claim 10, further comprising the step of evacuating the chamber.

* * * * *